United States Patent
Schultz et al.

(10) Patent No.: US 8,358,553 B2
(45) Date of Patent: Jan. 22, 2013

(54) INPUT/OUTPUT BANK ARCHITECTURE FOR AN INTEGRATED CIRCUIT

(75) Inventors: David P. Schultz, San Jose, CA (US); Sanford L. Helton, San Jose, CA (US); Richard W. Swanson, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 355 days.

(21) Appl. No.: 12/795,602

(22) Filed: Jun. 7, 2010

(65) Prior Publication Data
US 2011/0299351 A1    Dec. 8, 2011

(51) Int. Cl.
*G11C 7/00*    (2006.01)
(52) U.S. Cl. ... 365/219; 365/220; 365/221; 365/189.08; 365/189.03; 365/189.17
(58) Field of Classification Search ........... 365/219, 365/220, 221, 189.03, 189.08, 189.17
See application file for complete search history.

(56) References Cited

U.S. PATENT DOCUMENTS

| | | | | |
|---|---|---|---|---|
| 6,650,141 B2 * | 11/2003 | Agrawal et al. | | 326/41 |
| 6,831,480 B1 * | 12/2004 | Shumarayev et al. | | 326/38 |
| 6,903,575 B1 * | 6/2005 | Davidson et al. | | 326/47 |
| 7,020,728 B1 | 3/2006 | Jones et al. | | |
| 7,071,756 B1 * | 7/2006 | Vadi et al. | | 327/293 |
| 7,098,685 B1 * | 8/2006 | Agrawal et al. | | 326/38 |
| 7,167,023 B1 | 1/2007 | Pan et al. | | |
| 7,208,975 B1 * | 4/2007 | Agrawal et al. | | 326/38 |
| 7,242,218 B2 * | 7/2007 | Camarota et al. | | 326/41 |
| 7,518,396 B1 * | 4/2009 | Kondapalli et al. | | 326/38 |
| 7,519,888 B2 * | 4/2009 | Tabatabaei et al. | | 714/733 |
| 7,571,267 B1 * | 8/2009 | Luis | | 710/62 |
| 7,573,295 B1 * | 8/2009 | Stadler | | 326/40 |
| 7,624,297 B2 * | 11/2009 | Baumgartner et al. | | 713/501 |
| 7,646,217 B2 * | 1/2010 | Venkata et al. | | 326/41 |
| 7,965,575 B2 * | 6/2011 | Kajigaya | | 365/230.03 |
| 8,049,531 B2 * | 11/2011 | Golbus et al. | | 326/41 |
| 2011/0205824 A1 * | 8/2011 | Kajigaya | | 365/219 |
| 2011/0298511 A1 | 12/2011 | Swanson et al. | | |
| 2011/0299347 A1 | 12/2011 | Swanson et al. | | |
| 2011/0302356 A1 | 12/2011 | Helton | | |

* cited by examiner

*Primary Examiner* — Viet Q Nguyen
(74) *Attorney, Agent, or Firm* — Kevin T. Cuenot

(57) ABSTRACT

An integrated circuit can include an input/output (I/O) bank. The I/O bank can include a plurality of byte clock groups. Each byte clock group can include at least one phaser configured to clock circuit elements of the byte clock group at a frequency at which a source synchronous device coupled to the byte clock group communicates data.

19 Claims, 5 Drawing Sheets

INPUT/OUTPUT BANK ARCHITECTURE FOR AN INTEGRATED CIRCUIT

FIELD OF THE INVENTION

One or more embodiments disclosed within this specification relate to integrated circuits (ICs). More particularly, one or more embodiments relate to input/output bank architectures for use within an IC.

BACKGROUND

Programmable integrated circuit (IC) devices are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect and programmable logic circuits are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAS) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

SUMMARY

One or more embodiments disclosed within this specification relate to integrated circuits (ICs) and, more particularly, to input/output (I/O) bank architectures for use within an IC. One embodiment of the present invention can include an IC that includes an I/O bank. The I/O bank can include a plurality of byte clock groups. Each byte clock group can include at least one phaser configured to clock circuit elements of the byte clock group at a frequency at which a source synchronous device coupled to the byte clock group communicates data.

Another embodiment of the present invention can include an I/O bank disposed within an IC. The I/O bank can include a first byte clock group including a first clock source configured to clock circuit elements within the first byte clock group operating at approximately a frequency at which a source synchronous device coupled to the first byte clock group communicates data. The I/O bank can include a second byte clock group including a second clock source configured to clock circuit elements within the second byte clock group operating at approximately a frequency at which a source synchronous device coupled to the second byte clock group communicates data. The first clock source can be independent of the second clock source.

Another embodiment of the present invention can include an IC having an I/O bank. A plurality of byte clock groups can be disposed within the I/O bank. Each of the plurality of byte clock groups can be independently configurable to implement a different source synchronous interface. Each byte clock group can include at least one phaser, I/O circuitry, and at least one first-in-first-out (FIFO) memory. The at least one phaser can be configured to clock circuit elements of the byte clock group that operate at a frequency at which a source synchronous device communicates data to the byte clock group. The I/O circuitry can include a plurality of I/O blocks coupled to a plurality of serializer/deserializers. The I/O circuitry can be clocked by the at least one phaser. The at least one FIFO memory can be coupled to the I/O circuitry. The at least one FIFO memory can include a first port clocked at a first frequency and a second port clocked at a second frequency. At least one of the first port or the second port can be clocked by the at least one phaser.

DETAILED DESCRIPTION OF THE DRAWINGS

While the specification concludes with claims defining the features of one or more embodiments of the invention that are regarded as novel, it is believed that the one or more embodiments of the invention will be better understood from a consideration of the description in conjunction with the drawings. As required, one or more detailed embodiments of the present invention are disclosed herein; however, it is to be understood that the one or more embodiments disclosed are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of one or more embodiments of the invention.

One or more embodiments disclosed within this specification relate to integrated circuits (ICs) and, more particularly, to a bank of inputs and outputs for use within an IC. In accordance with one or more embodiments of the present invention, an architecture for a bank of inputs and outputs (I/O bank) is provided that facilitates communication with source synchronous devices. The architecture allows the I/O bank to be utilized as one or more independently configurable interfaces for communicating with one or more source synchronous devices located off-chip.

In one aspect, clock resources can be included within the I/O bank itself, e.g., local to the particular pins of the I/O bank used to implement a source synchronous interface. A greater level of control over clock functions can be achieved through the inclusion of clock generation and management resources within the I/O bank itself. Further control over clock functions can be facilitated by limiting the number of pins within the I/O bank that are controlled by each clock resource. This local approach of clock generation and management within the I/O bank for a limited set of pins provides lower skew and higher performance than other conventional I/O bank architectures. Conventional I/O banks, for example, typically include or are driven by one or more global clocks that drive many circuit elements throughout the IC. The global clock signals, not being locally generated with respect to the I/O bank, are subject to loading effects that induce jitter, delay, and the like on the clock signals thereby reducing the accuracy and reliability of the I/O bank as a synchronous interface.

Figure 1:
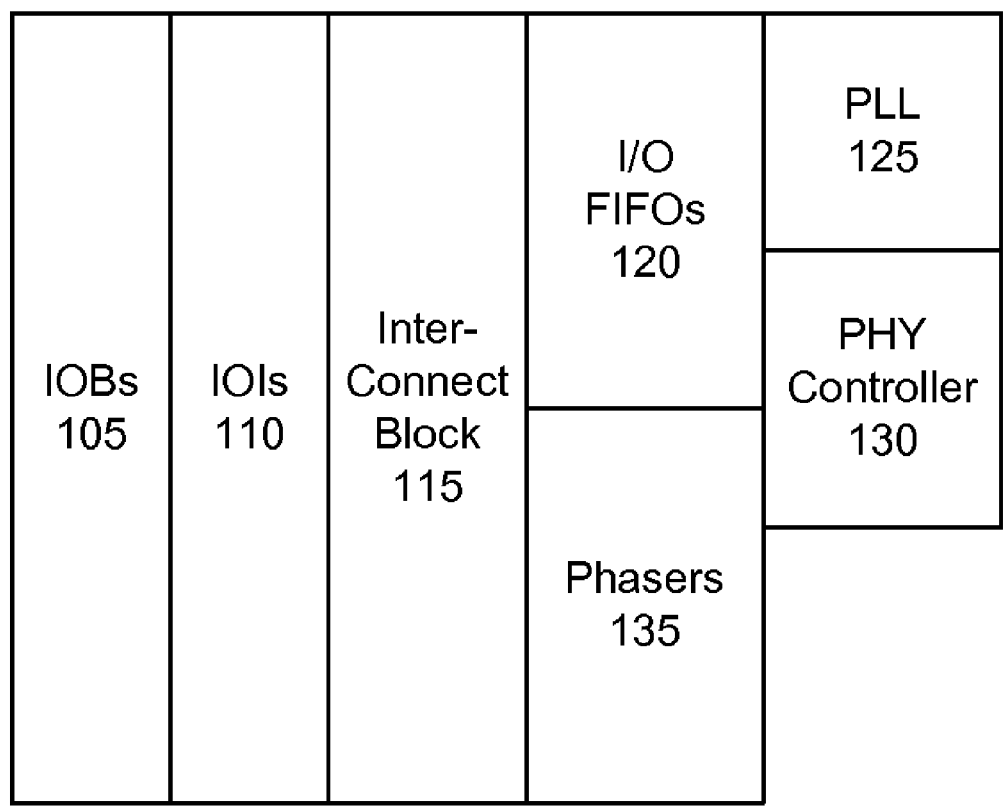
FIG. 1 is a first block diagram illustrating an input/output (I/O) bank of an integrated circuit in accordance with one embodiment of the present invention.

FIG. 1 is a first block diagram illustrating an I/O bank 100 of an integrated circuit in accordance with one embodiment of the present invention. I/O bank 100 can be configured to implement a source synchronous interface that facilitates communication between the IC within which I/O bank 100 is disposed and any of a variety of different types of source synchronous devices.

In one or more embodiments, the IC within which one or more I/O banks, such as I/O bank 100, can be implemented can be a programmable IC. The one or more embodiments disclosed herein, however, are not intended to be limited to implementation or use within programmable ICs. Rather, I/O bank 100 can be implemented in any of a variety of different types of ICs. For example, I/O bank 100 can be implemented within a processor having an embedded memory controller, an application specific IC, a mixed signal IC, or other type of non-programmable IC.

One example of a source synchronous device that can be coupled to I/O bank 100 is a memory device. I/O bank 100 can be coupled to any of a variety of dual data rate (DDR) synchronous dynamic random access memory (SDRAM) devices. Examples of DDR type SDRAM devices can include, but are not limited to, DDR type memory devices, DDR2 type memory devices, DDR3 type memory devices, low power DDR (LPDDR or mobile DDR) type memory devices, or the like. Further examples can include, but are not limited to, quad data rate II (QDRII), reduced latency dynamic random access memory (RLDRAMII), networking sources, multimedia sources, or the like.

In general, I/O bank 100 can include a plurality of IOBs 105, a plurality of I/O interconnect tiles (IOIs) 110, an interconnect block 115, and a plurality of I/O first-in-first-out memories (I/O FIFOs) 120. I/O bank 100 also can include a phase lock-loop (PLL) 125, a physical interface controller (PHY controller) 130, and a plurality of phasers 135.

Taken collectively, IOBs 105 and IOIs 110 form I/O circuitry of I/O bank 100. IOBs 105 represent one or more circuit elements that implement input and output functions. Each IOB, for example, can be configured for bidirectional operation and, as such, can include an input buffer and an output buffer. The input buffer and the output buffer can be coupled to a pad of the IC through which a signal, e.g., a single bit signal, can be output to a target external to the IC via the output buffer or through which a signal can be received from the source external to the IC through the input buffer. IOBs 105 are coupled to IOIs 110. In general, IOIs 110 can include a plurality of serializers and a plurality of deserializers.

As shown, IOIs 110 can be coupled to interconnect block 115, which in turn is coupled to I/O FIFOs 120. In one or more embodiments, interconnect block 115 can be implemented as interconnect circuitry that is used to couple configurable circuit elements in two different columns of circuitry. In this regard, while I/O FIFOs 120 are separated by IOIs 110, I/O FIFOs 120 can be said to be disposed immediately adjacent to IOIs 110 as interconnect block 115 includes routing resources that can be, at least in part, configurable.

Interconnect block 115 provides interconnects to facilitate programmable routing between IOIs 110 and I/O FIFOs 120. For example, in the case where the IC is a programmable IC, routes coupling I/O FIFOs 120 with IOIs 110 can be determined according to configuration data loaded into configuration memory cells of the programmable IC. Interconnect block 115 also provides access to IOIs 110 from the programmable fabric that implements user-specified circuitry of the IC, e.g., when the IC is configured as a programmable IC such as a field programmable gate array (FPGA).

Though interconnect block 115 provides programmable connectivity between IOIs 110 and I/O FIFOs 120, one or more signals to be described herein can be directly routed across the area represented by interconnect block 115. The direct routes facilitate faster and more efficient signal routing for more sensitive signals. The signal routes, for example, can be considered "hardened" or said to be a "hard circuit." As such, the hardened routes, as compared to programmable routes, induce fewer artifacts such as jitter and delay on the signals.

A "hard circuit" refers to a predetermined and, thus, preconfigured circuit, whether a circuit block or a wire, e.g., a route, that is implemented within an IC. A hard circuit, for example, while sometimes being at least partially configurable in some respect, is not instantiated by loading configuration data into the programmable IC. The hard circuit exists on the programmable IC irrespective of whether configuration data is loaded and, in general, is dedicated to a particular purpose as are the various blocks described herein.

By comparison, a "soft circuit" refers to a circuit design that is specified using software, e.g., a programmatic description of the circuit specified using a hardware description language, netlist, or the like. The programmatic description of the circuit design is converted, e.g., compiled, into configuration data that can be loaded into configuration memory cells of the programmable IC. Loading the configuration data into configuration memory cells effectively instantiates a circuit design within the programmable IC. More particularly, the configuration data, when loaded into the programmable IC, configures general programmable or configurable circuitry within the programmable IC to implement the specified circuit design and/or routes, e.g., wiring.

I/O FIFOs 120 can include one or more input FIFO memories and one or more output FIFO memories. Each output FIFO memory can be configured to send data and/or commands from the IC to the source synchronous device. Each input FIFO memory can be configured to receive data from the source synchronous device within the IC. Each of I/O FIFOs 120 can be configured to implement an asynchronous clock domain boundary. For example, each of I/O FIFOs 120 can include one port that is configured to operate at a first frequency that is approximately equal to the frequency of operation of the source synchronous device (SSD frequency) and a second port that is configured to operate at a second, and typically slower, frequency at which one or more other systems within the IC are, or can be, configured to operate (IC frequency).

PLL 125 can generate one or more clock signals utilized, for example, by PHY controller 130 and phasers 135. PHY controller 130 can provide centralized control over phasers 135. In general, PHY controller 130 can control the transfer of data through I/O FIFOs 120 responsive to control words received from a user circuit such as a memory controller, for example. In one or more embodiments, PHY controller 130 also can facilitate an asynchronous clock boundary by receiving the control words at a rate corresponding to the IC frequency. PHY controller 130, however, can execute the received control words and control operation of at least a portion of I/O FIFOs 120, via phasers 135, at or about the SSD frequency.

Phasers 135 are a type of clock resource configurable to provide a variety of clock generation and clock management functions. Each of phasers 135, for example, can create the read interface and/or write interface clocks used within I/O bank 100. Phasers 135 can generate clock signals for distribution to the components within I/O bank 100 that operate at the SSD frequency. Each of phaser 135, for example, can be configured to receive a continuous frequency reference clock and one or more of phasers 135 can be configured to receive a non-continuous phase reference. Additional control and/or reset signals also can be provided to each of phasers 135.

As shown, phasers 135, like I/O FIFOs 120, can be disposed within a column directly adjacent to I/O circuitry and, for example, IOIs 110. Locating phasers 135 adjacent to I/O circuitry allows clock routing to be direct and short, thereby reducing and/or eliminating jitter injection points that arise from the use of multiple stages of circuitry and coupling and/or crossing signal lines.

Each of phasers 135 can, for example, establish frequency lock with the continuous frequency reference clock that can be provided by PLL 125. Once frequency lock is achieved, each of phasers 135 can output one or more signals having a fixed phase relationship to the phase reference clock. The phase reference clock, for example, can be a data strobe signal, e.g., a "DQS signal," that is received via an external pin from the source synchronous device. One or more of phasers 135, for example, also can perform strobe signal detection and capture as well as generate further clock pulses that are phase and frequency aligned to a received strobe signal when the strobe signal terminates or discontinues pulses. The additional pulses allow data to be clocked through I/O bank 100 for output to one or more other systems or circuit elements within the IC.

In one or more embodiments, each of phasers 135 can be configured to generate a full-rate clock, e.g., at approximately the same frequency as the reference signal or SSD frequency, and one or more divided clocks. Each divided clock can be a frequency divided version of the full-rate clock. The divisor used can be selectable, e.g., one, two, four, etc. Each of the frequency divided clocks also can have a selectable phase variance or relationship with respect to the full-rate clock. For example, each of phasers 135 can output one or more divided clocks. The phase of each divided clock can be set within each phaser 135 in increments, for example, of approximately one-half of the period of the full-rate clock. The dividing circuitry disposed within each of phasers 135 can be programmable. Accordingly, when a phaser 135 is reset, the phase relationship specified via the programmability of phaser 135 is maintained or otherwise preserved.

For example, when the frequency divided clocks have a frequency that is approximately one half of the full rate clock, the phase variance can be selectable in terms of being approximately in phase or approximately 180 degrees out of phase with the full rate clock. When the frequency divided clocks have a frequency that is approximately one-fourth of the full rate clock, the phase variance can be selectable in terms of being approximately in phase, approximately 90 degrees out of phase, approximately 180 degrees out of phase, or approximately 225 degrees out of phase with the full rate clock.

By including clocking circuitry that is dedicated for use in implementing a source synchronous interface within I/O bank 100, distortions and jitter in the clocking signals can be minimized. In one or more embodiments, one input phaser and one output phaser can be implemented for a limited number of IOBs 105. For example, each set of 12 IOBs 105 can be controlled by one input phaser and/or one output phaser as the case may be. Restricting the number of pads controlled by a particular one of phasers 135 reduces the load on the clock signals and further reduces distortions and/or jitter on the clock signals.

By comparison, conventional I/O banks not only utilize global clock signals that are subject to heavy loading, but typically each pin and its associated I/O circuitry is clocked by a same clock signal. Thus, in cases where each I/O bank includes approximately 40-50 pins, each of the 40-50 pins is controlled by a same clock signal. In this regard, conventional I/O banks provide little of control over the clock signal for purposes of clock/data alignment as is necessary for implementing a source synchronous interface.

Figure 2:
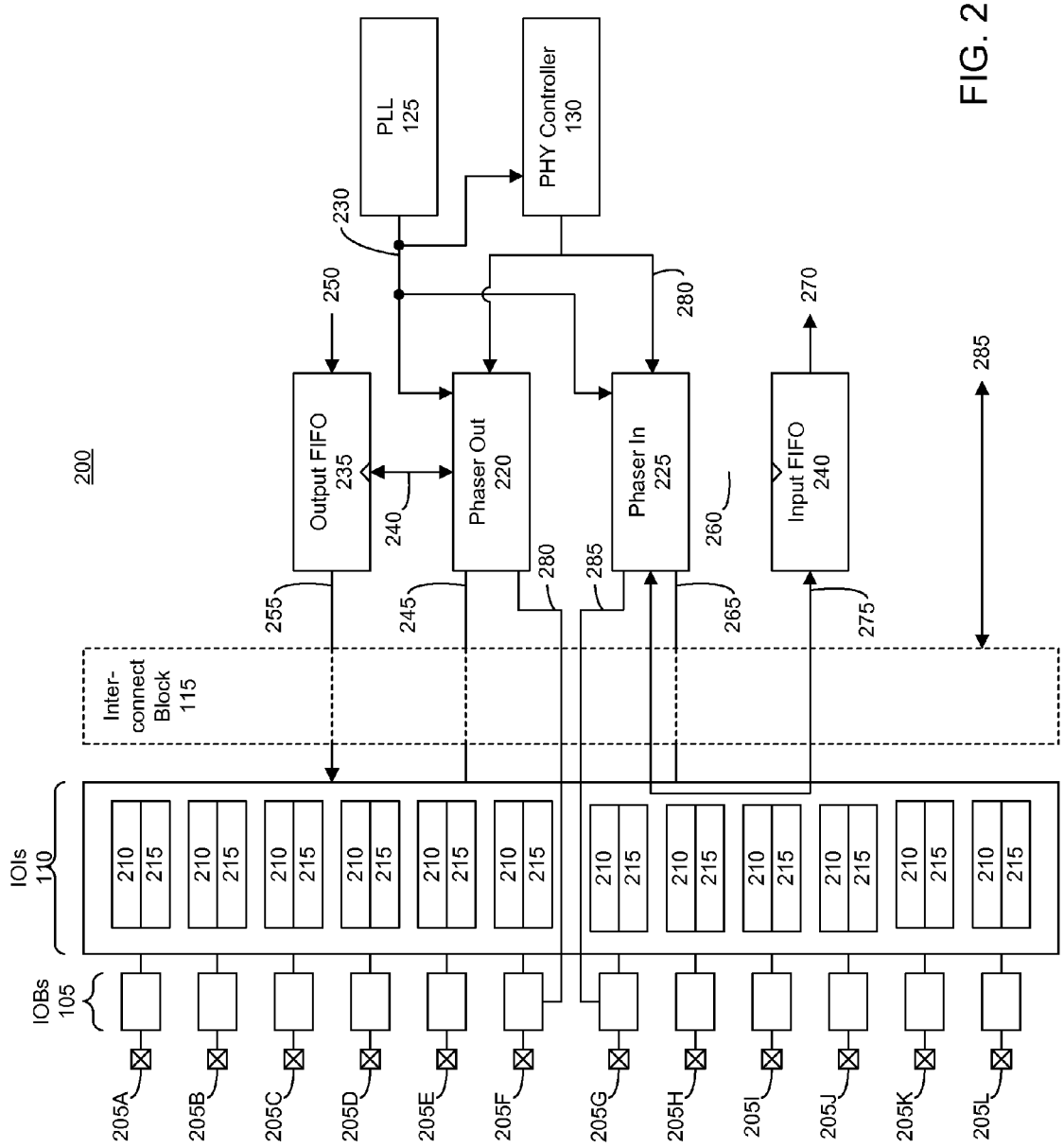
FIG. 2 is a second block diagram illustrating a portion of an I/O bank of an integrated circuit in accordance with another embodiment of the present invention.

FIG. 2 is a second block diagram illustrating a portion of an I/O bank of an integrated circuit in accordance with another embodiment of the present invention. More particularly, FIG. 2 illustrates a byte clock group 200 of I/O bank 100 in accordance with another embodiment of the present invention.

As noted, byte clock group 200 represents a limited portion of I/O bank 100. In one or more embodiments, byte clock group 200 can include 12 IOBs 105, with each IOB being coupled to one of 12 pads illustrated as pads 205A-205L. Each IOB 105 can be configured for bidirectional operation. For example, in one or more embodiments, I/O bank 100 can include four byte clock groups of the variety illustrated in FIG. 2. As shown, byte clock group 200 includes dedicated clock generation and clock management resources for use exclusively by components within byte clock group 200. In this regard, each byte clock group included within I/O bank 100 can control the clock signals used therein independently of each other byte clock group within the same I/O bank.

IOIs 110 can include a plurality of output serial/deserializers (SERDES) 210 and a plurality of input SERDES 215. In one or more embodiments, byte clock group 200 can include 12 output SERDES 210 and 12 input SERDES 215. For example, each IOB 105 can be coupled to one output SERDES 210 and one input SERDES 215. Each output SERDES 210 can be configured to receive data from within the IC and serialize the data before sending to the source synchronous device through IOBs 105 and corresponding pads 205A-205L. Each input SERDES 215 can be configured to receive data from the source synchronous device and deserialize the received data before providing the data to other components or systems within the IC, e.g., via interconnect block 115, in FIFO 220, or the like.

Interconnect block 115 provides programmable interconnects to facilitate programmable routing between IOIs 110 and I/O FIFOs 120. As noted, interconnect block 115 also provides access to IOIs 110 from the programmable fabric of the IC, e.g., when the IC is a programmable IC. In this regard, signal 285 can represent one or more signals that can be coupled to the programmable fabric of the IC to send one or more signals received within byte clock group 200 to the programmable fabric or to receive one or more signals from the programmable fabric for output to the source synchronous device.

Phaser out 220 and phaser in 225 provide a mechanism for creating phase-adjusted clock signals for byte clock group 200. In general, phaser out 220 can be configured to generate write interface clocks. In some cases, phaser out 220 also can be used to generate read interface clocks. Phaser in 225 can be configured to generate read interface clocks. The phasers, in reference to both phaser out 220 and phaser in 225, can be used to implement a source synchronous interface including multiple data lanes or channels. Each data lane or channel, in general, can utilize a same clock signal, though each clock signal can have a unique phase. Phaser out 220 and phaser in 225 each provide clock signals to the output SERDES 210 and the input SERDES 215 as well as 10 of the 12 IOBs 105.

In general, phaser out 220 and phaser in 225 can utilize frequency-locked and voltage regulated delay lines to phase shift source synchronous data and/or control signals. For example, referring to phaser in 225, the incoming clock (not shown) that can be adjusted can be an incoming data strobe signal, e.g., in the case of DDR2 and/or DDR3, or a free running clock in the case of QDRII, RLDRAMII, networking, multimedia, or the like. Phaser out 220 can be configured to adjust an output clock, e.g., signals 260 and/or 265, used with either data and/or control signals.

Operation of phaser out 220 and phaser in 225 can be coordinated or controlled by PHY controller 130 to be described in greater detail within this specification. Phaser out 220 and phaser in 225 can receive a reference signal 230, e.g., a frequency reference signal, from PLL 125. Signal 230 can be at the SSD operating frequency. From the received reference signal 230, phaser out 220 can generate one or more clock signals at the SSD frequency with varying phase offsets.

For example, phaser out 220 can generate a plurality of clock signals at the SSD frequency wherein each clock signal has a different, e.g., a unique, phase offset. Phaser out 220 is coupled to output FIFO 235 via signal 240 and coupled to each output SERDES 210 via signal 245. Signals 240 and 245 can represent, at least in part, one or more clock signals generated and provided by phaser out 220 at the SSD frequency with varying phase offsets for controlling portions of the data output path that operate at the SSD frequency. For example, phaser out 220 can provide clocking signals necessary to operate output SERDES 210 and an output port of output FIFO 235 at a rate corresponding to, or clocked by, the SSD frequency.

Phaser out 220 can generate an output clock signal at approximately the SSD frequency, a frequency divided version of the output clock signal, and a phase-adjusted version of the output clock signal wherein the phase can be selectively altered. The output clock signal, e.g., the full rate clock signal, can be frequency matched with the frequency reference signal, e.g., signal 230. The output clock signal can have a fixed phase offset as compared to a received phase reference signal (not shown). The phase reference signal, for example, can be a non-continuous signal that is maintained within predetermined bounds. In one example, the phase reference signal can be a strobe or DQS signal.

Phaser out 220 further can generate a phase shifted version, e.g., a 90-degree phase shifted version, of the full rate clock signal that can be utilized when byte clock group 200 is used to implement an interface for communicating with DDR3, QDRII, RLDRAMII, networking, multimedia, etc. type of devices. In one or more embodiments, phaser out 220 can utilize frequency-locked voltage-regulated delay lines to perform phase adjustment. The phase relationship between the full rate clock and the phase shifted version of the full rate clock can be specified using phase increment/decrement control signals. Each increment control signal can cause a predetermined amount of delay, e.g., some fraction such as $\frac{1}{32}$ of the period of the full rate clock signal as can be provided by a delay line within phaser out 220, to be added to the phase shifted version of the full rate clock. Each decrement control signal can cause the predetermined amount of delay to be removed from the phase shifted version of the full rate clock. In this manner, the phase shifted version of the full rate clock can be phase-adjusted with respect to the full rate clock to a desired phase offset.

As noted, the frequency divided clock signal can be phase aligned with the full rate clock signal. In one or more embodiments, a phase offset of the frequency divided signal clock signal output from phaser out 220 can be selected. The phase offset of the frequency divided signal can be specified in coarse increments of approximately one-half of the period of the reference signal.

Output FIFO 235 can be configured as a dual port memory having an input port and an output port that can operate asynchronously with respect to one another. The input port of output FIFO 235 can be coupled, for example, to a user circuit, such as a memory controller (not shown), via signal 250 over which data is received and clocked into output FIFO 235 at a rate corresponding to the IC frequency. In one or more embodiments, the input port of output FIFO memory 235 can be controlled by the user circuit which can, for example, provide data to output FIFO 235 via signal 250 and further control write enabling of the input port of output FIFO 235.

The output port of output FIFO 235 can output data via signal 255 to output SERDES 210 through interconnect block 115. The output port of output FIFO 235 can be clocked according to a clock signal at the SSD frequency that is generated by phaser out 220 and represented, at least in part, by signal 240. Phaser out 220 further can regulate the output port of output FIFO 235, e.g., read enabling the output port, to control the flow of data output from out FIFO 235 to output SERDES 110. Phaser out 220 controls the flow of data output from out FIFO 235 responsive to commands received via signal 280 from PHY controller 130. Output SERDES 210 can serialize data received from output FIFO 235 and output the resulting serialized data to IOBs 105 and pads 205A-205E and 205H-205L.

In one or more embodiments, output FIFO 235 can be configured to operate in a first mode having 12 data inputs and 12 data outputs. Each data input and each data output can be configured to be 4 bits wide. Output FIFO 235, for example, can be configured in this mode to accommodate eight entries. In a second and alternate mode, output FIFO 235 can be configured to have 10 data inputs with each being 8 bits wide. Output FIFO 235 can be configured to have 10 data outputs with each data output being 4 bits wide. In the second mode, output FIFO 235 can accommodate 8 entries. In the second mode, a 2:1 multiplexer can be added in the output data path and used to serialize the input data to a smaller output data width. The second mode of operation can be used, for example, when the output clock controlling the output port of output FIFO 235 is approximately twice the frequency that drives the input port of output FIFO 235.

Like phaser out 220, phaser in 225 can generate one or more clock signals at the SSD frequency. In one or more embodiments, phaser in 225 can generate a plurality of clock signals at the SSD frequency wherein each clock signal has a different phase. Phaser in 225 is coupled to input FIFO 240 via signal 260 and coupled to input SERDES 215 via signal 265. Signals 260 and 265 can represent, at least in part, one or more clock signals generated and provided by phaser in 225 at the SSD frequency for controlling portions of the data input path that operate at the SSD frequency. For example, phaser in 225 can provide clocking signals necessary to operate input SERDES 215 and an input port of input FIFO 240 at a rate corresponding to, e.g., clocked by, the SSD frequency.

For example, phaser in 225 can be configured to perform fine adjustment of the clock signal that is used to capture incoming, e.g., read, data. Phaser in 225 further can perform functions such as detecting a first pulse of a strobe from the source synchronous device, and create a free running clock that is phase aligned with the strobe signal that is received and detected. Phaser in 225, unlike phaser out 220, for example, can include a squelch controller that, responsive to a squelch control signal (not shown), can synchronously squelch a received reference signal such as a phase reference signal. The term "squelch" or "squelching" can refer to pulling a signal either high or low and retaining the signal in that state for a period of time, e.g., the period of time the signal is to be squelched. Whether the signal is pulled high or low can vary according to the configuration of the particular circuit to which the signal is being provided.

Input FIFO 240 can be configured as a dual port memory having an input port and an output port that can operate asynchronously with respect to one another. The output port of input FIFO 240 can be coupled, for example, to user circuitry such as a memory controller via signal 270, over which data is read out of input FIFO 240 at a rate corresponding to the IC frequency. In one or more embodiments, the output port of input FIFO 240 can be controlled by the user circuit which can, for example, read data out of input FIFO 240 via signal 270 and further control read enabling of the output port of input FIFO 240.

The input port of input FIFO 240 can receive data via signal 275 from input SERDES 215 through interconnect block 115. The input port can be clocked according to a clock signal at the SSD frequency that is generated by phaser in 225 and represented, at least in part, by signal 260. Phaser in 225 can regulate the input port of input FIFO 240, e.g., write enabling the input port, to control the flow of data into input FIFO 240 from each input SERDES 215. Phaser in 225, for example, operates under the control of PHY controller 130 to respond to commands received via signal 280. Each input SERDES 215 can deserialize data received from the source synchronous device via pads 205A-205E and 205H-205L. Each input SERDES 215 can output the resulting deserialized data to input FIFO 240.

In one or more embodiments, input FIFO 240 can be configured to operate in a first mode having 12 data inputs and 12 data outputs. Each data input and each data output can be configured to be 4 bits wide. Input FIFO 240, for example, can be configured in this mode to accommodate eight entries. In a second and alternate mode, input FIFO 240 can be configured to have 10 data inputs, with each being 8 bits wide. Out FIFO 235 can be configured to have 10 data outputs, with each data output being 4 bits wide. In the second mode, input FIFO 240 can accommodate 8 entries. In the second mode, data can be de-multiplexed to form a larger output width. The second mode of operation can be used, for example, when the output port of input FIFO 240 is clocked approximately one-half of the frequency that clocks the input port of input FIFO 240.

In one or more embodiments, output FIFO 235 and input FIFO 240 can be physically aligned within byte clock group 200 as shown. Thus, within a given I/O bank, including four byte clock groups, each of the FIFOs, e.g., eight FIFOs in total corresponding to four in FIFOs and four out FIFOs, can be physically aligned with the particular IOBs belonging to the same byte clock group as the FIFOs.

In one or more embodiments, connections between the FIFOs and the IOIs can be configured in such a way to allow for data to be transferred using a single hop or wire through the interconnect block. Connections configured with a single hop, for example, can be implemented using a fixed mapping of signals between IOBs and FIFOs. Similarly, the clock signals provided by each phaser and the read and/or write enable signals provided by each phaser to the FIFOs can be dedicated, e.g., hardened, connections rather than clocks routed from the interconnect fabric typically used within a programmable IC.

As shown, each of phaser out 220 and phaser in 225 can have one or more direct and dedicated signal connections that can be coupled to IOB 205F and 205G. Phaser out 220 out can be directly coupled to IOB 205F via signal 280. Phaser in 225 can be directly coupled to IOB 205G via signal 285. Signals 280 and 285 can represent one or more signals that effectively circumvent interconnect block 115 and/or IOI 110. For example, signals 280 and 285 can be implemented using a direct wire that is not a part of interconnect block 115 or IOI 110 and, thus, is not programmable. Signals 280 and 285 can be contrasted with the connections between FIFOs and IOIs previously described in that such connections, while limited to a single hop, still are part of, and flow through, interconnect block 115. Further, signals 280 and 285 flow directly to IOBs 105 and circumvent IOIs 110 as shown.

For example, signal 280 can be used by phaser out 220 to output a strobe signal that can be used to clock data that is output from the IC to the source synchronous device when the IC is writing data. Signal 285 can be used by phaser in 225 to receive a strobe signal sent from the source synchronous device when the IC is reading data. In illustration, while byte clock group 200 can include 12 IOBs 105, ten of IOBs 105 can be reserved for communicating data, e.g., sending or receiving. Two of the IOBs 105 can be reserved for clock signals and can be coupled to signal 280 and/or 285. For example, pads 205F and 205G can be reserved for coupling to signals 280 and/or 285 respectively, though other pads and/or corresponding IOBs 105 can be reserved as may be desired. As shown, pads 205F and 205G can be substantially aligned so that a relatively direct and straight signal path exists between phaser out 220 and pad 205F and phaser in 225 and pad 205G.

In one or more embodiments, phaser out 220 and phaser in 225 can be configured to have a frequency range of approximately 125 MHz to approximately 1066 MHz. This frequency range facilitates data rates from approximately 250 Mbps for DDR2 configurations to approximately 2133 Mbps for DDR3 configurations. In the case of DDR3 DIMM interfaces, for example, all I/O in an I/O bank can be configured as data (DQ) pins or as data strobe (DQS) pins. In another example, each byte clock group including 12 I/Os and associated phasers, e.g., phaser out 220 and phaser in 225, can be used independently.

In the case of a DDR3 configuration, which utilizes bi-directional data strobes and data, both phaser out 220 and phaser in 225 of byte clock group 200, e.g., any phaser out or phaser in a byte clock group for DDR3, is used. By comparison, in the case of RLDRAMII, which utilizes unidirectional data pins, only phaser out 220 or phaser in 225 can be used depending on whether byte clock group 200 is used for reading or writing data. Taking another example, in the case of QDRII+ interfaces, the read data clocks called CQ/CQ# are nominally complementary signals but have separate phase requirements. Phaser in 225 can be configured to generate the CQ signal and phaser out 220 can be configured to function as a secondary phaser in to process the CQ# signal.

Figure 3:
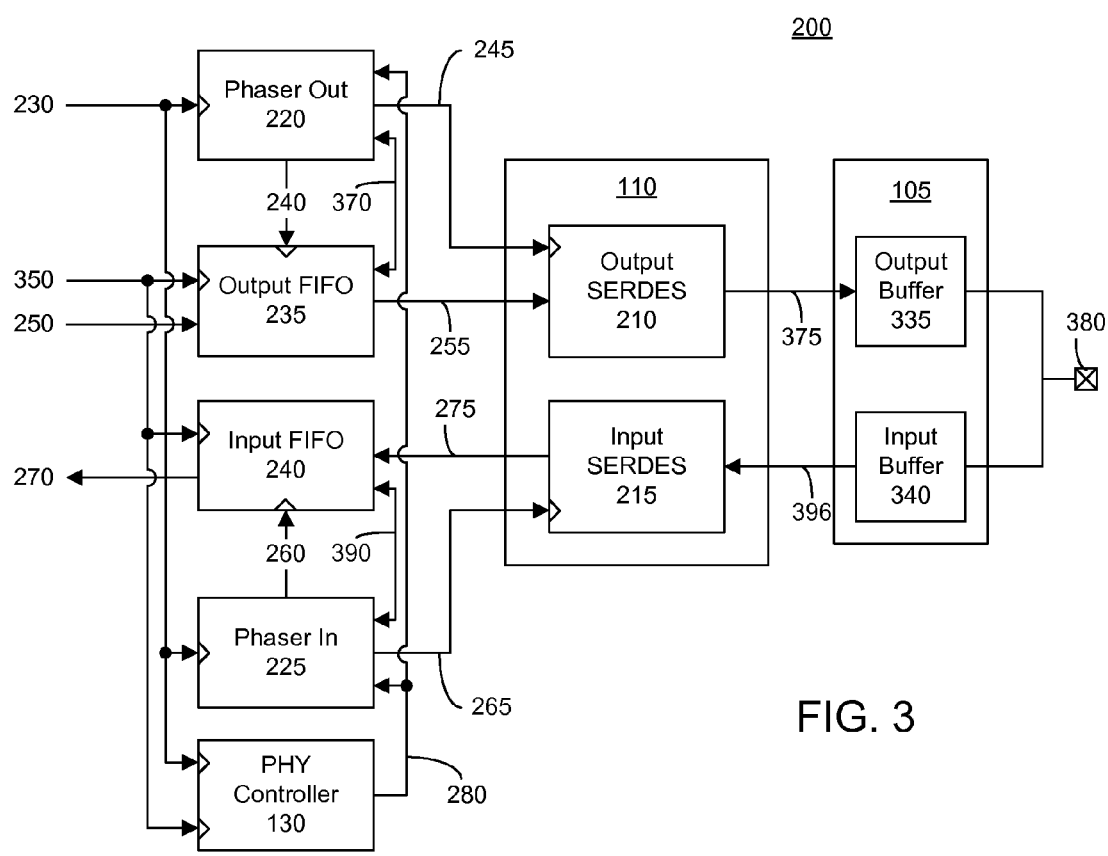
FIG. 3 is a third block diagram illustrating another aspect of an I/O bank in accordance with another embodiment of the present invention.

FIG. 3 is a third block diagram illustrating another aspect of an I/O bank configured in accordance with another embodiment of the present invention. FIG. 3 illustrates an exemplary data architecture for byte clock group 200. For purposes of illustration, only a single IOI 110 and a single IOB 105 are shown. Byte clock group 200 can include phaser out 220, phaser in 225, output FIFO 235, input FIFO 240, and PHY controller 130. IOI 110 can be configured to include output SERDES 210 and input SERDES 215. IOBs 105 can include an output buffer 335 and an input buffer 340.

Phaser out 220 and phaser in 225 can receive a clock signal 230, which can be at the SSD frequency. In one or more embodiments, clock signal 230 can be generated locally by a source (not shown). Phaser out 220, in turn, can generate one or more clock signals at the SSD frequency. In one or more embodiments, phaser out 220 can generate a plurality of clock signals at the SSD frequency wherein each clock signal has a different phase offset. Phaser out 220 is coupled to output FIFO 235 via signal 240 and coupled to OUTPUT SERDES 210 via signal 245. Signals 240 and 245 can represent, at least in part, one or more clock signals generated and provided by phaser out 220 at the SSD frequency for controlling those portions of the data output path that operate at the frequency of the memory device.

It should be appreciated that output SERDES 210 can require an additional clock signal to facilitate serialization of data. Thus, in one or more embodiments, signal 245 can represent a first clock signal at the SSD frequency and a second clock signal having a frequency that is a fraction of the SSD frequency, wherein the fraction used depends upon the degree of serialization being performed by output SERDES 210. The second clock signal, for example, can be ½, ⅓, ¼, ⅙, ⅐, ⅛, or the like.

Output FIFO 235 can be configured as a dual port memory having an input port and an output port that can operate asynchronously with respect to one another. The input port of output FIFO 235 can be coupled to a memory controller or other user circuit via signal 250, over which data is received and, thus, clocked by clock signal 350 at the IC frequency. In one or more embodiments, the input port of output FIFO 235 can be write enabled via the memory controller. The output port of output FIFO 235 can be indirectly controlled by PHY controller 130 via signals 280 and 370 to read data from output FIFO 235 responsive to received PHY control words from the memory controller. For example, PHY controller 130 can instruct, via signal 280, phaser out 220 to read enable the output port of output FIFO 235 via signal 370. As shown, PHY controller 130 also can receive clock signal 350 corresponding to the IC frequency and clock signal 230 corresponding to the SSD frequency. Data can be read from output FIFO 235 only when the data belonging to, or associated with, the received PHY control word(s) are available.

The output port of output FIFO 235 can output data to output SERDES 210 through signal 255. The output port can be clocked according to a clock signal at the SSD frequency that is generated by phaser out 220 and represented, at least in part, by signal 240. Phaser out 220 can regulate the output port of output FIFO 235, e.g., read enabling the output port, to control the flow of data from output FIFO 235 to output SERDES 210 via signal 370. Output SERDES 210 serializes data received from output FIFO 235 via signal 255 and outputs the resulting serialized data to output buffer 335 via signal 375. Output buffer 335 then outputs the serial data to the memory device via pin 380.

Like phaser out 220, phaser in 225 can generate one or more clock signals at the SSD frequency. In one or more embodiments, phaser in 225 can generate a plurality of clock signals at the SSD frequency wherein each clock signal has a different phase. Phaser in 225 is coupled to input FIFO 240 via signal 260 and coupled to input SERDES 215 via signal 265. Signals 260 and 265 can represent, at least in part, one or more clock signals generated and provided by phaser in 225 at the SSD frequency for controlling those portions of the data input path that operate at the frequency of the memory device.

Input SERDES 215, like output SERDES 210, can require an additional clock signal to facilitate de-serialization of data. Thus, in one or more embodiments, signal 265 can represent a first clock signal at the SSD frequency and a second clock signal having a frequency that is a fraction of the SSD frequency, wherein the fraction used depends upon the degree of de-serialization being performed by input SERDES 215. The second clock signal, for example, can be ½, ⅓, ¼, ⅙, ⅐, ⅛, or the like.

Input FIFO 240 can be configured as a dual port memory having an input port and an output port that can operate asynchronously with respect to one another. The output port of input FIFO 225 can be coupled to the memory controller via signal 270, over which data is sent. In one or more embodiments, the output port of input FIFO 240 can be read enabled via the memory controller and clocked by clock signal 350. The input port of input FIFO 240 can be indirectly controlled by PHY controller 130, e.g., via signals 280 and 390, to write data out to input FIFO 240 responsive to received PHY control words from the memory controller. For example, PHY controller 130 can instruct, via signal 280, phaser in 225 to write enable the input port of input FIFO 240 via signal 390.

Input SERDES 215 deserializes data received from input buffer 340 from pin 380. Input buffer 340 conveys data to input SERDES 215 via signal 396. Input SERDES 215 outputs the resulting deserialized data to the input port of input FIFO 240 via signal 275. The input port of input FIFO 240 can receive data from input SERDES 215 through signal 275. The input port of input FIFO 240 can be clocked according to a clock signal at the SSD frequency that is generated by phaser in 225 and represented, at least in part, by signal 260. Phaser in 225 can regulate the input port of input FIFO 240, e.g., write enabling the input port, to control the flow of data into input FIFO 240 from input SERDES 215 via signal 390.

Figure 4:
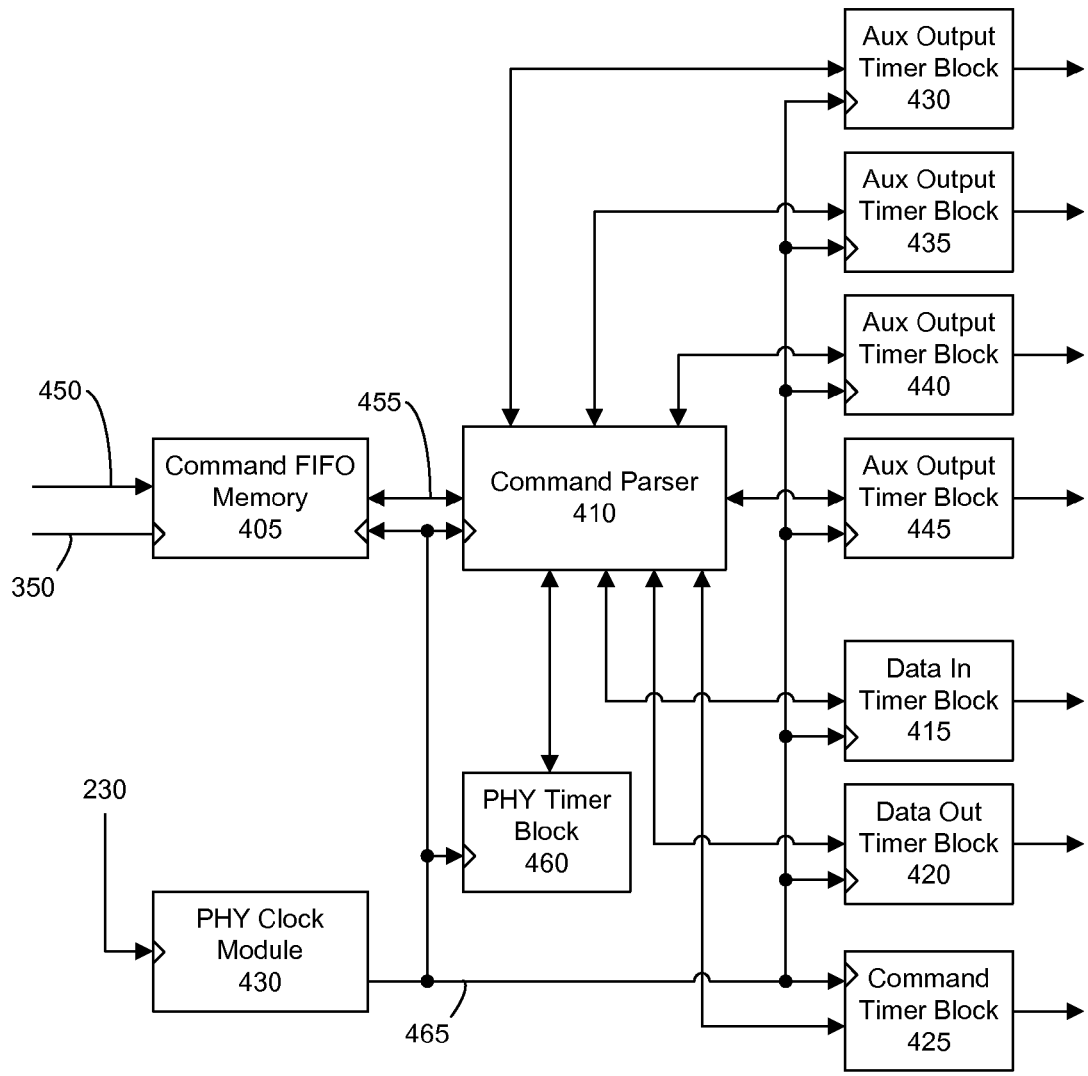
FIG. 4 is a fourth block diagram illustrating another aspect of an I/O bank in accordance with another embodiment of the present invention.

FIG. 4 is a fourth block diagram illustrating another aspect of an I/O bank in accordance with another embodiment of the present invention. FIG. 4 illustrates an example of the PHY controller 130 in greater detail than illustrated with reference to FIGS. 1-3. As shown, PHY controller 130 can include a command FIFO memory 405, a command parser 410, a PHY clock module 430, and a plurality of timer blocks.

In general, PHY controller 130 can include two data timer blocks including a data in timer block 415 and a data out timer block 420, a command timer block 425, four auxiliary timers depicted as aux output timer blocks 430, 435, 440, and 445, and PHY timer block 460. It should be appreciated that each timer block illustrated within FIG. 4 can represent one or more, e.g., a plurality, of individual timers available for the purposes described within this specification.

Command FIFO memory 405 can be configured as an asynchronous FIFO having an input port and an output port. Command FIFO memory 405 provides a mechanism for crossing clock domains between that of the memory controller corresponding to the IC operating frequency and the memory device corresponding to the MD operating frequency. The input port of command FIFO memory 405 can be coupled to the memory controller via signal 450 and can be clocked by clock signal 350 at the IC frequency. The second port of command FIFO memory 405 can be coupled to command parser 410 via signal 455 and is clocked at the SSD frequency via signal 465. Each other circuit element within FIG. 4 of PHY control block 210 is clocked at the SSD frequency by signal 465.

PHY clock module 430 can receive clock signal 230 at the SSD frequency as an input signal and generate one or more clock signals such as clock signal 465 as output. Clock signal 465 can be at approximately the SSD frequency to clock circuits operating at the same approximate speed as the memory device.

Command FIFO memory 405 receives PHY control words sent from the memory controller via signal 450, which can be read according to clock signal 465. For purposes of illustration, signal 455 can represent the transfer of data from command FIFO memory 405 in addition to a read enable signal for the output port of command FIFO memory 405 controlled by command parser 410.

Command parser 410 reads PHY command words from command FIFO memory 405 and, in response to executing the PHY command words, writes particular timer values determined by virtue of the PHY command words executed into data in timer block 415, data out timer block 420, command timer block 425, aux output timer blocks 430-445, and/or PHY timer block 460. Command parser 410 can continuously read from command FIFO memory 405 as long as there are available timers, e.g., an available data timer and/or command timer. When all of the data and/or command timers are busy, e.g., no timer is available, command parser 410 can stop reading PHY command words from command FIFO memory 405. By discontinuing the reading of PHY command words, command parser 410 places back pressure on the memory controller which detects the full or filling state of command FIFO memory 405 so as to throttle the flow of commands.

In general, data in timer block 415, data out timer block 420, and/or command timer block 425 can control the management of data and commands going into and coming out from a byte clock group of an I/O bank by timing the relationships between command issuance and data availability. For example, command timer 425 can cause an event that sends a CAS strobe initiating a read event. Data in timer block 415 determines the number of clock cycles after the assertion of the CAS strobe when data is available at an output of the input SERDES and is available for transfer to a user. The timer event generated by data in timer block 415 indicates availability of the data. Thus, timers within data in timer block 415 and/or data out timer block 420 can generate events that indicate when to start or stop clocks and when to enable ports of one of the FIFOs. In this manner, data in timer block 415, data out timer block 420, and command timer block 425 can control the flow of data and commands.

Aux output timer blocks 430-445 can include a plurality of timers configured to perform general purpose timing operations. Aux output timer blocks 430-445, for example, can be invoked by command parser 410 at the same time as a command associated with the timer is executed.

In one or more embodiments, the outputs from the timer blocks 415-445 can be multiplexed. Those circuit elements corresponding to data paths as illustrated with reference to FIG. 3, for example, can be coupled, via the multiplexers, to the data timer blocks 415, 420, and/or one of aux output timer blocks 430-445. The control signals from PHY controller 130 described with reference to FIG. 3 can be provided or output from the data in timer block 415 and/or data out timer block 420 as the case may be. Those circuit elements corresponding to command paths, for example, can be coupled to the command timer block 425. The control signals relating to commands can be provided or output from command timer block 425.

For example, referring again to FIG. 3 in combination with FIG. 4, data in timer block 415 can time the reception of data from an input SERDES. Data in timer block 415 further can manage the interface to a phaser in. When an active timer within data in timer block 415 reaches the terminal count, data in timer block 415 sends an "In_Burst_Pending" signal to the phaser in controlling the data path. The phaser in can generate the write enable signals and necessary clock signal to receive the data burst from the input SERDES. The phaser in further, in response, can write the data burst into the input FIFO. In conjunction with the "In_Burst_Pending" signal, data in timer block 415 also can send the current DDR Rank being read to the phaser in.

Data out timer block 420 can time when data is read from the output FIFO and transferred to the output SERDES. Data out timer block 420 can drive an "Out_Burst_Pending" signal high for one clock cycle at the frequency of the memory device for each DDR burst of data read from the output FIFO. The amount of data read from the output FIFO can be indicated by a "BURST_MODE" attribute. For example, the "BURST_MODE" attribute can be set high for a burst length of eight transactions and can be set low for a burst length of four transactions.

Command timer block 425 can be used to time when address and/or command information is read from an output FIFO memory configured to provide such address and/or command information to the memory. Command timer block 425 further can time when address and/or command information is transferred to the output SERDES. There is no need for control of the phasers or tri-state signals from command timer block 425. Only one nibble is read from an output FIFO for each command timer block 425 event.

PHY timer block 460 is a circuit block that can include one or more timers configured to control higher level functions and timing relationships. PHY timer block 460, unlike other timing blocks illustrated in FIG. 4, does not generate an outbound signal that is distributed outside of PHY controller 130. Rather, PHY timer block 460 communicates with command parser 410 to control different functions within PHY controller 130. In communicating with command parser 410, PHY timer block 460, for example, controls whether or not command parser 410 sends new timer events to other ones of timer blocks 415-445.

In this regard, PHY timer block 460 can cause an event, e.g., a timer event, to occur later in time than the occurrence of the command that initiates the timer event. Thus, the timer event originating from command parser 410 can be delayed under the control of PHY timer block 460. A timer event can remain active for a programmable duration referred to as the event duration under the control of PHY timer block 460.

Aux output timer blocks 430-445 can generate signals to the memory device that do not occur at the exact time as data transfers or commands. The signals can be staggered. Aux output timer blocks 430-445 also can be used to implement "on-die termination" or "ODT" signals within an interface.

For example, timers within PHY timer block 460 can be used to sequence continuous read and/or write commands such as those directed to a same column or general location within the memory device. In another example, timers within PHY timer block 460 also can be used to control spacing between commands issued to the memory device and the number of commands issued over a specified time period.

In further illustration of the functionality that can be achieved through PHY timer block 460, one or more timers within PHY timer block 460 can be used to implement row/bank timers. Row/bank timers enforce rules governing how a memory interface communicates with different banks or pages of a given memory device. For example, row/bank timers can control how close in time access to different banks can occur with respect to one another. In still another example, timers within PHY timer block 460 can control read/write or write/read turnaround. Read/write turnaround timers control how much time must separate a write command that follows a read command. Similarly, a write/read turnaround timer can control how much time must separate a read command that follows a write command.

Figure 5:
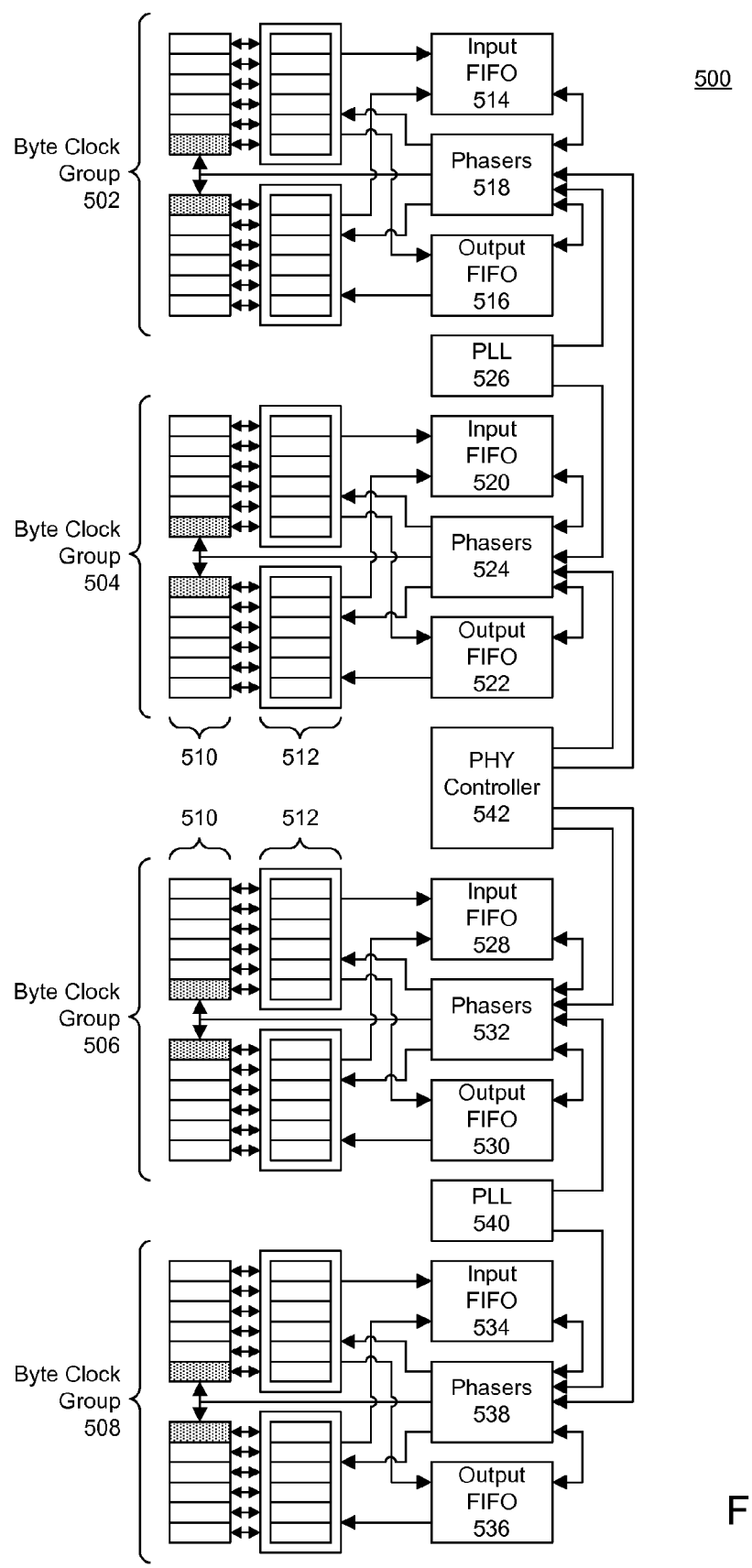
FIG. 5 is a fifth block diagram illustrating another aspect of an I/O bank in accordance with another embodiment of the present invention.

FIG. 5 is a fifth block diagram illustrating an I/O bank 500 in accordance with another embodiment of the present invention. I/O bank 500 illustrates an exemplary I/O bank architecture that includes four byte clock groups 502, 504, 506, and 508. As illustrated, each of byte clock groups 502-508 includes 12 IOBs 510 and 12 IOIs 512. The IOBs 510 that can be reserved for use in receiving or sending strobe signals are illustrated with shading and further include direct connections to the particular phaser of the byte clock group within which the dedicated IOBs 510 are disposed.

Byte clock group 502 can include an input FIFO 514 and an output FIFO 516. For purposes of illustration, input phasers and output phasers are collectively represented by a single phaser block. Accordingly, byte clock group 502 can include phaser 518 that is dedicated to providing clock signals to input FIFO 514, output FIFO 516, the IOIs 512 within byte clock group 502, and the IOBs 510 within byte clock group 502.

Byte clock group 504 can include an input FIFO 520 and an output FIFO 522. Accordingly, byte clock group 504 can include phaser 524 that is dedicated to providing clock signals to input FIFO 520, output FIFO 522, the IOIs 512 within byte clock group 504, and the IOBs 510 within byte clock group 504. PLL 526 can provide reference signals to each of phasers 518 and 524.

Byte clock group 506 can include an input FIFO 528 and an output FIFO 530. Byte clock group 506 can include phaser 532 that is dedicated to providing clock signals to input FIFO 528, output FIFO 530, the IOIs 512 within byte clock group 506, and the IOBs 510 within byte clock group 506.

Byte clock group 508 can include an input FIFO 534 and an output FIFO 536. Accordingly, byte clock group 508 can include phaser 538 that is dedicated to providing clock signals to input FIFO 534, output FIFO 536, the IOIs 512 within byte clock group 508, and the IOBs 510 within byte clock group 508. PLL 540 can provide reference signals to each of phasers 532 and 538.

Each of phasers 518, 524, 532, and 538 can be controlled by PHY controller 542. FIG. 5 illustrates an exemplary architecture in which the I/O circuitry, e.g., IOBs 510 and IOIs 512, are immediately adjacent to the various clock resources within I/O bank 500. It should be appreciated that I/O bank 500 can include additional clock resources (not shown) that typically available within an I/O bank such as global clock signals. The architecture shown in FIG. 5, however, illustrates that additional clock resources can be disposed within I/O bank for purposes of forming one or more source synchronous interfaces. Each of byte clock groups 502-508 can be configured independently to form one of four possible source synchronous interfaces with dedicated clock resources.

One or more embodiments disclosed within this specification relate to an I/O bank that can be used for implementing a source synchronous interface to a source synchronous device. The I/O bank can include clock generation and/or management circuit resources that facilitate greater control over clocking and, thus, increase accuracy of the interface.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. An integrated circuit comprising:
an input/output (I/O) bank comprising a plurality of byte clock groups, wherein each of the plurality of byte clock groups comprises at least one phaser configured to clock circuit elements of the byte clock group at a frequency at which a source synchronous device coupled to the byte clock group communicates data,
wherein the at least one phaser of each of the plurality of byte clock groups is independently configurable.

2. The integrated circuit of claim 1, wherein the at least one phaser within each of the plurality of byte clock groups is configured to generate a first clock signal having a frequency that is approximately equal to a frequency at which the source synchronous device communicates data and a second clock signal that is a frequency divided version of the first clock signal.

3. The integrated circuit of claim 1, wherein the at least one phaser within each of the plurality of byte clock groups is configured to generate a third clock signal that is shifted 90 degrees from a phase of the first clock signal.

4. The integrated circuit of claim 1, wherein the I/O bank further comprises:
a plurality of input serializer/deserializers (SERDES) configured to deserialize data received from the source synchronous device; and
a plurality of output SERDES configured to serialize data to be output to the source synchronous device,
wherein the at least one phaser within each of the plurality of byte clock groups is configured to provide clock signals to each of the plurality of input SERDES and each of the plurality of output SERDES of the byte clock group.

5. The integrated circuit of claim 4, wherein within each of the plurality of byte clock groups, the at least one phaser is immediately adjacent to the plurality of input SERDES and the plurality of output SERDES.

6. The integrated circuit of claim 1, wherein each byte clock group further comprises:
an output first-in-first-out (FIFO) memory comprising at least two asynchronously clocked ports, wherein an output port of the output FIFO is clocked by the at least one phaser; and
an input FIFO memory comprising at least two asynchronously clocked ports, wherein an input port of the input FIFO is clocked by the at least one phaser.

7. The integrated circuit of claim 6, further comprising:
a physical interface controller configured to coordinate operation of each phaser of each of the plurality of byte clock groups, wherein the physical interface controller comprises a plurality of timers that specify when, for each byte clock group, the at least one phaser of the byte clock group clocks data out from the output FIFO memory and clocks data into the input FIFO memory.

8. The integrated circuit of claim 1, wherein each of the plurality of byte clock groups further comprises:
a plurality of input serializer/deserializers (SERDES) configured to deserialize data received from the source synchronous device;
a plurality of output SERDES configured to serialize data to be output to the source synchronous device;
an input first-in-first-out (FIFO) memory comprising at least two asynchronously clocked ports, wherein an input port of the input FIFO memory is coupled to the plurality of input SERDES and is configured to receive deserialized data; and
an output FIFO memory comprising at least two asynchronously clocked ports, wherein an output port of the output FIFO memory is coupled to the plurality of output SERDES,
wherein the at least one phaser within the byte clock group clocks each of the plurality of output SERDES, each of the plurality of input SERDES, the input port of the input FIFO memory, and the output port of the output FIFO memory and controls write enabling of the input port of the input FIFO memory and read enablement of the output port of the output FIFO memory to regulate data flow into the input FIFO memory and out from the output FIFO memory.

9. The integrated circuit of claim 1, wherein the I/O bank is configurable to implement one of a plurality of different source synchronous interfaces.

10. An input/output (I/O) bank disposed within an integrated circuit, the I/O bank comprising:
a first byte clock group comprising a first clock source configured to clock circuit elements within the first byte clock group operating at approximately a frequency at which a first source synchronous device coupled to the first byte clock group communicates data; and
a second byte clock group comprising a second clock source configured to clock circuit elements within the second byte clock group operating at approximately a frequency at which a second source synchronous device coupled to the second byte clock group communicates data,
wherein the first clock source is independent of the second clock source.

11. The I/O bank of claim 10, wherein the first byte clock group further comprises, an input first-in-first-out (FIFO) memory configured to receive data via an input port clocked by the first clock source and an output FIFO memory configured to output data via an output port clocked by the first clock source, and wherein the second byte clock group further comprises an input FIFO memory configured to receive data via an input port clocked by the second clock source and an output FIFO memory configured to output data via an output port clocked by the second clock source.

12. The I/O bank of claim 11, wherein the input FIFO memory of the first byte clock group and the input FIFO memory of the second byte clock group each comprises an output port configured to operate at a frequency different from the input port.

13. The I/O bank of claim 11, wherein the output FIFO memory of the first byte clock group and the output FIFO memory of the second byte clock group each comprises an input port configured to operate at a frequency different than the output port.

14. The I/O bank of claim 11, wherein the first clock source and the second clock source each is located immediately adjacent to input/output circuitry of the I/O bank.

15. An integrated circuit comprising:
an input/output (I/O) bank;
a plurality of byte clock groups disposed within the I/O bank, wherein each of the plurality of byte clock groups is independently configurable to implement a different source synchronous interface, wherein each byte clock group comprises:
at least one phaser configured to clock circuit elements of the byte clock group that operate at a frequency at which a source synchronous device communicates data to the byte clock group;
I/O circuitry comprising a plurality of I/O blocks coupled to a plurality of serializer/deserializers, wherein the I/O circuitry is clocked by the at least one phaser; and
at least one first-in-first-out (FIFO) memory coupled to the I/O circuitry, wherein the at least one FIFO memory comprises a first port clocked at a first frequency and a second port clocked at a second frequency, wherein at least one of the first port or the second port is clocked by the at least one phaser.

16. The integrated circuit of claim 15, wherein the at least one phaser within each of the plurality of byte clock groups is further configured to generate a first clock signal having a frequency that is approximately equal to the frequency at which the source synchronous device communicates data; a second clock signal that is a frequency divided version of the first clock signal, and a third clock signal shifted 90 degrees from a phase of the first clock signal.

17. The integrated circuit of claim 15, wherein the at least one phaser within each of the plurality of byte clock groups is located immediately adjacent to the I/O circuitry of the byte clock group.

18. The integrated circuit of claim 15, wherein the I/O bank comprises a physical interface controller configured to coordinate operation of each phaser of each of the plurality of byte clock groups, wherein the physical interface controller comprises a plurality of timers that specify when, for each byte clock group, the at least one phaser of the byte clock group clocks data out or in to the at least one FIFO memory.

19. The integrated circuit of claim 18, wherein the physical interface controller is configured to receive control words at a first data rate corresponding to the first frequency and execute the control words at a second data rate corresponding to the second frequency.

* * * * *